(12) United States Patent
McCollum et al.

(10) Patent No.: US 9,520,448 B1
(45) Date of Patent: Dec. 13, 2016

(54) COMPACT RERAM BASED PFGA

(71) Applicant: Microsemi SoC Corporation, San Jose, CA (US)

(72) Inventors: John L. McCollum, Orem, UT (US); Fethi Dhaoui, Mountain House, CA (US)

(73) Assignee: Microsemi SoC Corporation, San Jose, CA (US)

( * ) Notice: Subject to any disclaimer, the term of this patent is extended or adjusted under 35 U.S.C. 154(b) by 0 days.

(21) Appl. No.: 15/233,054

(22) Filed: Aug. 10, 2016

Related U.S. Application Data

(62) Division of application No. 15/010,222, filed on Jan. 29, 2016, now Pat. No. 9,444,464.

(60) Provisional application No. 62/132,333, filed on Mar. 12, 2015.

(51) Int. Cl.
| | |
|---|---|
| *G11C 11/00* | (2006.01) |
| *H01L 27/24* | (2006.01) |
| *H03K 19/177* | (2006.01) |
| *H01L 21/768* | (2006.01) |
| *H01L 45/00* | (2006.01) |

(52) U.S. Cl.
CPC ......... *H01L 27/2454* (2013.01); *H01L 21/768* (2013.01); *H01L 45/16* (2013.01); *H03K 19/1776* (2013.01)

(58) Field of Classification Search
CPC .................................................... G11C 11/00
USPC .......... 365/46, 94, 100, 129, 148, 158, 163; 257/2–5, 9, 295, 310, E21.35; 438/95, 96, 438/135, 166, 240, 365, 482, 486, 597, 785
See application file for complete search history.

(56) References Cited

U.S. PATENT DOCUMENTS

| | | | | |
|---|---|---|---|---|
| 6,373,745 | B2 * | 4/2002 | Saito | ..................... G11C 11/412 365/174 |
| 2001/0033511 | A1 * | 10/2001 | Saito | ..................... G11C 11/412 365/174 |
| 2004/0125643 | A1 | 7/2004 | Kang et al. | |
| 2007/0146012 | A1 | 6/2007 | Murphy et al. | |
| 2010/0110767 | A1 | 5/2010 | Katoh et al. | |
| 2011/0044089 | A1 * | 2/2011 | Goux | .................. G11C 11/5614 365/148 |

OTHER PUBLICATIONS

European Patent Office, International Search Report issued in PCT/US2016/015756, May 19, 2016, 4 pages.

(Continued)

*Primary Examiner* — Harry W Byrne
(74) *Attorney, Agent, or Firm* — Leech Tishman Fuscaldo Lampl; Kenneth D'Alessandro, Esq.

(57) ABSTRACT

A push-pull resistive random access memory cell circuit includes an output node, a word line, a first bit line, and a second bit line. A first resistive random access memory device is connected between the first bit line and the output node and a second resistive random access memory device is connected between the output node and the second bit line. A first programming transistor has a gate connected to the word line, a drain connected to the output node, and a source. A second programming transistor has a gate connected to the word line, a drain connected to the source of the first programming transistor, and a source. The first and second programming transistors have the same pitch, the same channel length, and the same gate dielectric thickness, the gate dielectric thickness chosen to withstand programming and erase potentials encountered during operation of the push-pull ReRAM cell circuit.

9 Claims, 1 Drawing Sheet

(56) References Cited

OTHER PUBLICATIONS

European Patent Office, Written Opinion issued in PCT/US2016/015756, May 19, 2016, 8 pages.

* cited by examiner

COMPACT RERAM BASED PFGA

CROSS REFERENCE TO RELATED APPLICATIONS

This application is a divisional of co-pending U.S. patent application Ser. No. 15/010,222, filed Jan. 29, 2016, which claims the benefit of International Patent Application No. PCT/US2016/015756, filed Jan. 29, 2016 and of U.S. Provisional Patent Application No. 62/132,333 filed Mar. 12, 2015, the contents of which are incorporated herein by reference in their entirety.

BACKGROUND

Push-pull resistive random access memory (ReRAM) cells, such as the ones disclosed in U.S. Pat. No. 8,415,650, are attractive for use in configuration memory for configurable logic integrated circuits such as field programmable gate arrays (FPGAs).

When designing circuits using deep sub-micron (14 nM and beyond) transistors, any change in transistor pitch forces designers to use a large transition region to allow photolithographic production of the pattern. This transition region can range from 0.2 um to 1 um or more and can be a significant disadvantage in designing a configurable logic integrated circuit employing ReRAM push-pull configuration memory cell circuits that has a compact efficient layout.

An FPGA requires logic, routing switches, and programming transistors to be intermingled. To eliminate the transition region which is required by photolithography processing requirements, all the above listed devices must have the same pitch, including channel length pitch. Normally this requirement is not compatible with devices that are operated at different voltages.

For ReRAM memory cells, the transistor devices used to program them will be subjected to higher drain and gate biases, and will switch at a higher gate bias during programming and operation as compared to other transistors employed in the integrated circuit.

Therefore, there is a need for a design for ReRAM configuration memory cells which is not associated with these disadvantages. An objective of the present invention is to provide ReRAM push-pull configuration memory cell circuits that eliminate this transition region.

SUMMARY

According to the present invention, a push-pull ReRAM cell circuit employs two programming transistors that are cascaded in series and have the same pitch and channel length. A switch transistor used in the push-pull ReRAM cell circuit has the same pitch and channel length as the two programming transistors in order to maintain the same pitch and channel length for both the programming devices and the switch transistors that are used to configure and/or interconnect the logic cells.

According to the present invention, the switch transistor whose state is configured by the ReRAM will use the same thick dielectric that is used in the programming transistors to mitigate elevated gate stress during programming. Use of a thicker dielectric also allows the gate of the configuration switch to be overdriven at higher $V_{CC}$ during operation, thus allowing the passage of the full $V_{CC}$ logic signal.

According to one aspect of the present invention, a push-pull resistive random access memory cell circuit includes an output node, a word line, a first bit line, and a second bit line. A first resistive random access memory device is connected between the first bit line and the output node and a second resistive random access memory device is connected between the output node and the second bit line. A first programming transistor has a gate connected to the word line, a drain connected to the output node, and a source. A second programming transistor has a gate connected to the word line, a drain connected to the source of the first programming transistor, and a source. The first and second programming transistors have the same pitch, the same channel length, and the same gate dielectric thickness, the gate dielectric thickness chosen to withstand programming and erase potentials encountered during operation of the push-pull ReRAM cell circuit.

According to another aspect of the present invention, at least one switch transistor has a gate connected to the output node, a drain connected to a first logic net node and a source connected to a second logic net node. The switch transistor has the same pitch, channel length, and gate dielectric thickness as the first and second programming transistors.

DRAWINGS

These and other features, aspects and advantages of the present invention will become better understood with regard to the following description, appended claims, and accompanying drawings where:

DESCRIPTION

Persons of ordinary skill in the art will realize that the following description of the present invention is illustrative only and not in any way limiting. Other embodiments of the invention will readily suggest themselves to such skilled persons.

Figure 1:
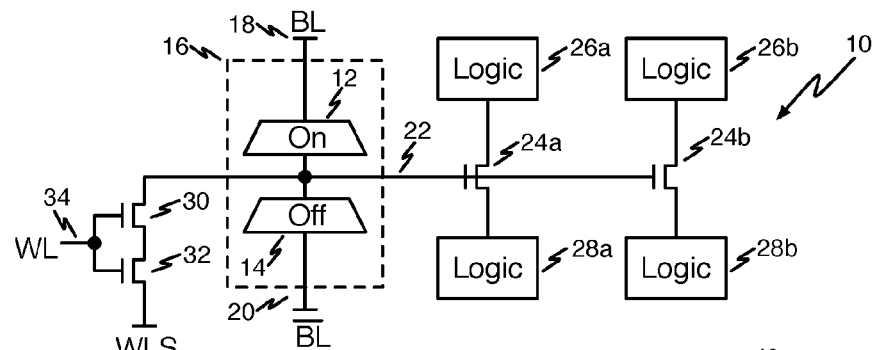
FIG. 1 is a schematic diagram of a push-pull ReRAM cell in accordance with one aspect of the present invention.

Referring first to FIG. 1, a schematic diagram shows an illustrative push-pull ReRAM cell circuit 10 in accordance with one aspect of the present invention. A first ReRAM device 12 is coupled in series with a second ReRAM device 14 to form a ReRAM cell 16. A first end of the series connected ReRAM devices 12, 14, at one terminal of ReRAM device 12, is coupled to a first bit line (BL) 18 and a second end of the series connected ReRAM devices 12, 14, at one terminal of ReRAM device 14, is coupled to a second bit line (Bl_bar) 20. The ReRAM cell 16 depicted in FIG. 1 is a front-to-back ReRAM cell, particularly useful for biasing a switch as shown, but persons of ordinary skill in the art will appreciate that back-to-back ReRAM cells could also be employed in the present invention.

As described above, ReRAM devices 12 and 14 together comprise a push-pull ReRAM cell 16. The common output node 22 between ReRAM devices 12 and 14 is connected to the gate of one or more switch transistors. FIG. 1 shows the common output node 22 connected to the gates of two switch transistors 24a and 24b. Switch transistor 24a is shown connected between two logic net nodes 26a and 28a. Similarly, switch transistor 24b is shown connected between two logic net nodes 26b and 28b. Persons of ordinary skill in the art will appreciate that logic net nodes 26a, 26b, 28a, and 28b can represent logic gates or other devices in a programmable integrated circuit that are connected together by the switch transistors 24a and 24b, respectively, and can also represent circuit nets in a single logic device in such an integrated circuit that define the function of the logic device, or can represent a wiring interconnection in a programmable integrated circuit.

While FIG. 1 shows multiple switch transistors 24a and 24b so that more than one logic circuit net can be activated by a single push-pull ReRAM cell 16, persons of ordinary skill in the art will appreciate that a single switch transistor could be connected to the common output node 22.

According to one aspect of the present invention, push-pull ReRAM cell 16 is programmed using a pair of n-channel programming transistors 30 and 32 cascaded in series. N-channel programming transistor 30 has its drain connected to the common output node 22 of the push-pull ReRAM cell 16, and its source connected to the drain of the n-channel programming transistor 32. In an actual embodiment, a single n+ region serves as the source of n-channel programming transistor 30 and the drain of n-channel programming transistor 32. The source of n-channel programming transistor 32 is connected to a word line WLS. By connecting two n-channel programming transistors 30 and 32 in series, both n-channel programming transistors 30 and 32 can be designed having the same pitch and channel length as the n-channel switch transistors 24a and 24b. The same pitch and channel length used for switch transistors 24a and 24b are used for the logic devices in the integrated circuit.

According to another aspect of the present invention, n-channel programming transistors 30 and 32 and n-channel switch transistors 24a and 24b are fabricated having the same gate dielectric thicknesses. N-channel programming transistors 30 and 32 have gate dielectric thicknesses selected to withstand the programming and erase potentials that the ReRAM push-pull memory cell will be subjected to during its operation. Most integrated circuits include input/output (I/O) transistors used to interface the integrated circuit with external components. Because these transistors interface with components that often operate at voltages higher than the voltages normally found internally in the integrated circuit, the I/O transistors are usually fabricated having gate dielectric thicknesses larger than other transistors used internally in the integrated circuit. It may therefore be convenient to employ n-channel programming transistors 30 and 32 having the same gate dielectric thicknesses as the I/O transistors.

Using the same larger gate dielectric thickness for the transistors 24a and 24b will mitigate elevated gate stress that switch transistors 24a and 24b would otherwise be subjected to during programming, because its gates are connected to the common node 22 of the push-pull ReRAM memory cell 16, and that node will experience programming voltages during erase and programming of the memory cell 16. Use of a thicker dielectric for switch transistors 24a and 24b also allows the gates of the switch transistors 24a and 24b to be overdriven at higher values of $V_{CC}$ during operation, thus allowing the switch transistors 24a and 24b to pass the full $V_{CC}$ logic signal. As an alternative, thin gate oxides can be used for the switch transistors 24a and 24b, but care should be taken to avoid stress during programming and erase operations. This may be done by raising the source/drain bias to $V_{CC}$ logic during programming.

In normal operation of the programmable integrated circuit, bit line BL 18 is connected to a voltage source $V_{CC}$ and BL_bar 20 is connected to a potential such as ground. The WLS line can be connected to ground or to a slightly positive potential such as 0.9V to limit leakage in the n-channel programming transistors 30 and 32. Push-pull ReRAM cell 16 is programmed so that only one of the ReRAM devices 12 and 14 is on at any one time, thus either pulling common node 22 up to the voltage on bitline BL 18 or pulling common node 22 down to the voltage on bitline BL_bar 20 (usually ground). Push-pull ReRAM cell 16 is shown in FIG. 1 with ReRAM device 12 turned on and ReRAM device 14 turned off. The common node 22 is thus pulled up to the voltage on bit line BL 18 ($V_{CC}$), thus turning on switch transistors 24a and 24b (shown in FIG. 1 as n-channel transistors).

Figure 2:
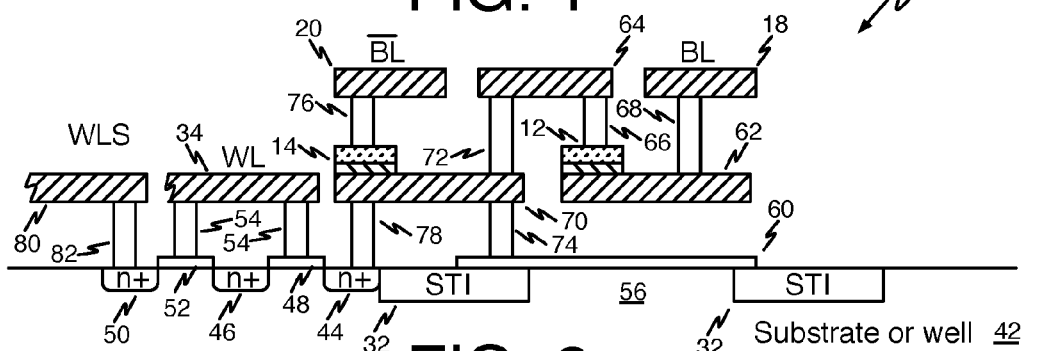
FIG. 2 is a cross-sectional view of an exemplary layout of the push-pull ReRAM cell of the present invention.
Figure 3:
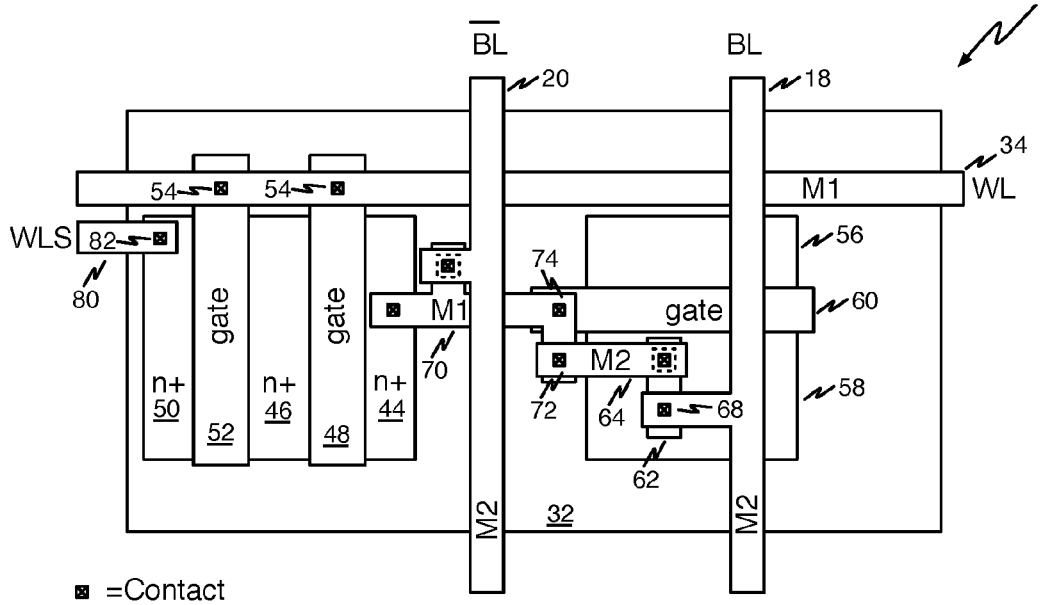
FIG. 3 is a top view of an exemplary layout of the push-pull ReRAM cell of the present invention.

Referring now to both FIG. 2 and FIG. 3, an exemplary layout of the push-pull ReRAM cell of the present invention is shown. FIG. 2 is a cross-sectional view of an exemplary layout 40 of the push-pull ReRAM cell circuit 10 of the present invention. FIG. 3 is a top view of an exemplary layout 40 of the push-pull ReRAM cell circuit 10 of the present invention. Persons of ordinary skill in the art will observe that the layouts shown in FIGS. 2 and 3 are illustrative only and non-limiting.

Push-pull ReRAM cell circuit 10 (FIG. 1) is formed in a p-type substrate or well 42 in an integrated circuit. N+ region 44 forms the drain of n-channel programming transistor 30 and n+ region 46 forms its source, as well as acting as the drain of n-channel programming transistor 32. Polysilicon or metal line 48 forms the gate of n-channel programming transistor 30. N+ region 50 forms the source of n-channel programming transistor 32 and polysilicon or metal line 52 forms its gate. Contacts 54 connect the polysilicon gates 48 and 52 of n-channel programming transistors 30 and 32 to word line 34, shown as being formed from a first metal interconnect layer (M1). Persons of ordinary skill in the art will appreciate that p-channel transistors may also be used in other embodiments of the invention.

The switch transistor shown in FIG. 3 includes source region 56 and drain region 58, separated by gate 60. It is noted that the cross sectional view of FIG. 2 is partially taken through the source region of one of switch transistors 24a and 24b. The switch transistors may be n-channel or p-channel devices.

ReRAM device 12 is formed between metal interconnect layers on the integrated circuit (for example between first and second metal layers M1 and M2). In FIGS. 2 and 3, ReRAM device 12 is shown formed between M1 metal segment 62 and M2 metal segment 64. ReRAM device 12 is formed over metal segment 62 and is connected to M2 metal segment 64 through contact 66. ReRAM device 12 is connected to bitline BL 18 through contact 68.

Contact to common node 22 is made from M2 segment 64 to an M1 metal segment 70 through contact 72. A contact 74 connects M1 metal segment 70 to polysilicon gate 60 of the switch transistor. ReRAM device 14 is shown formed between M1 metal segment 70 and the M2 metal segment forming second bitline Bl_bar 20. A contact 76 connects M1 ReRAM device 14 to second bitline Bl_bar 20. A contact 78 connects M1 metal segment 70 to the n+ region 44 forming the drain of n-channel programming transistor 30. A metal segment 80 forms the word line WLS and is connected to n+ region 50 forming the source of programming transistor 32 through contact 82.

Push-pull ReRAM cell 16 is programmed by turning on the desired one of ReRAM devices 12 and 14 so as to either turn off, or turn on, switch transistors 24a and 24b. First, both ReRAM devices 12 and 14 are erased. To erase a ReRAM device means to turn it off so that it does not pass current. To erase ReRAM device 12, bitline BL 18 is brought to a high voltage (e.g., 1.8V) and common node 22 is brought to ground. To avoid stressing ReRAM device 14, second bit line Bl_bar 20 is also brought to ground so that there is no potential impressed across ReRAM device 14. To erase ReRAM device 14, common node 22 is brought to a high voltage (e.g., 1.8V) and second bit line Bl_bar 20 is brought to ground. To avoid stressing ReRAM device 12, bitline BL 18 is also brought to the high voltage so that there is no potential impressed across ReRAM device 12.

After both ReRAM cells 12 and 14 have been erased, the selected one of the two ReRAM devices 12 and 14 is programmed. To program ReRAM device 12, bitline BL 18 is brought to ground and common node 22 is brought to a high voltage (e.g., 1.8V). To avoid stressing ReRAM device 14 while programming ReRAM device 12, second bit line Bl_bar 20 is also brought to the high voltage so that there is no potential impressed across ReRAM device 14. To program ReRAM device 14, common node 22 is brought to ground and second bit line Bl_bar 20 is brought to the high voltage. To avoid stressing ReRAM device 12, bitline BL 18 is also brought to ground so that there is no potential impressed across ReRAM device 12.

According to another aspect of the present invention, two series connected n-channel programming transistors 30 and 32 are coupled between common node 22 and word line WLS. The gates of n-channel transistors 30 and 32 are connected together to word line WL 34.

While the present disclosure is directed to the application of a ReRAM memory device where the logic is switching at a first voltage and the programming and erasing of the ReRAM cell is performed at a second voltage, persons of ordinary skill in the art will appreciate that it is also applicable to other devices where it is desirable to switch two different voltages in different operating modes.

Although the present invention has been discussed in considerable detail with reference to certain preferred embodiments, other embodiments are possible. Therefore, the scope of the appended claims should not be limited to the description of preferred embodiments contained in this disclosure.

What is claimed is:

1. A method for fabricating a push-pull resistive random access memory cell circuit comprising:
    the output node and the second bit line;
    forming source and drain regions for first and second programming transistors in a semiconductor substrate, the drain region for the second programming transistor connected to the source of the first programming transistor, the source and drain regions for first and second programming transistors formed such that the first and second programming transistors have an equal pitch and an equal channel length;
    forming gate dielectric regions over the source and drain regions for first and second programming transistors, the gate dielectric regions having equal thicknesses chosen to withstand programming and erase potentials encountered during operation of the push-pull ReRAM cell circuit;
    forming gate regions for the first and second programming transistors over the gate dielectric regions;
    forming a first dielectric region over the gates of the first and second programming transistors;
    forming in the first dielectric region a drain contact to the drain of the first programming transistor, a source contact to the source of the second programming transistor, and gate contacts to the gates of the first and second programming transistors;
    forming an output node, a word line source, and a word line for the memory cell circuit in a first metal interconnect layer, the output node connected to the drain contact, the word line source connected to the source contact, and the word line connected to the gate contacts of the first and second programming transistors;
    forming first and second resistive random access memory devices each having first and second terminals, the first terminal of each of the first and second resistive random access memory devices connected to the output node;
    forming a second dielectric region over the second terminals of the first and second resistive random access memory devices;
    forming in the second dielectric region a first bit line contact to the second terminal of the first resistive random access memory device and a second bit line contact to the second terminal of the second resistive random access memory device; and
    forming first and second bit lines in a second metal interconnect layer, the first bit line connected to the first bit line contact and the second bit line connected to the second bit line contact.

2. The method of claim 1, further comprising:
forming in the semiconductor substrate source and drain regions for input/output transistors at the same time as forming the source and drain regions for the first and second programming transistors; and
forming gate dielectric regions over the source and drain regions of the input/output transistors at the same time as forming the gate dielectric regions over the first and second programming transistors, the gate dielectric regions of the input/output transistors being equal to the thickness of the gate dielectric of the first and second programming transistors.

3. The method of claim 1, further comprising:
forming in the semiconductor substrate source and drain regions for at least one switch transistor in the push-pull resistive random access memory cell circuit at the same time as forming the source and drain regions for the first and second programming transistors, the source and drain regions for the at least one switch transistor formed such that the at least one switch transistor has a pitch and a channel length equal to the pitch and channel length, respectively, of the first and second programming transistors;
forming a gate dielectric region over the source and drain regions of the at least one switch transistor at the same time as forming the gate dielectric regions over the first and second programming transistors, the gate dielectric region of the at least one switch transistor having a thickness equal to the thickness of the gate dielectric of the first and second programming transistors; and
forming in the first dielectric region at the same time as forming the drain contact, the source contact, and the gate contacts, a switch gate contact to the gate of the at least one switch transistor.

4. The method of claim 1 further comprising:
forming in the semiconductor substrate source and drain regions for logic transistors at the same time as forming the source and drain regions for the first and second programming transistors;
forming gate dielectric regions over the source and drain regions for logic transistors, the gate dielectric regions for the logic transistors having thicknesses less than the thickness of the gate dielectric of the first and second programming transistors.

5. The method of claim 1 wherein forming source and drain regions for first and second programming transistors in a semiconductor substrate comprises forming a single region to serve as both the source of the first programming transistor and the drain of the second programming transistor.

6. The method of claim 1 wherein forming source and drain regions for first and second programming transistors in the semiconductor substrate comprises forming n-type regions in a p-type substrate.

7. The method of claim 6 wherein forming n-type regions in a p-type substrate comprises forming n-type regions in a p-type well.

8. A method for fabricating a push-pull resistive random access memory cell circuit for an integrated circuit on a semiconductor substrate, the method comprising:

forming active regions for first and second programming transistors and for at least one switch transistor in the semiconductor substrate and forming source and drain regions in the active regions for first and second programming transistors defining channels for the first and second programming transistors such that the first and second programming transistors have a pitch length and a channel length respectively equal to the pitch length and channel length of logic transistors formed in the integrated circuit;

forming source and drain regions defining a channel for the at least one switch transistor in the active region for at least one switch transistor;

forming gates for the first and second programming transistors over the channels for the first and second programming transistors, the gates for the first and second programming transistors both having a same thickness;

forming a gate for the at least one switch transistor over the channel for the at least one switch transistor;

forming contacts to each of the source and gate of the first programming transistor, to the drain and gate of the second programming transistor, and to the gate of the at least one switch transistor;

forming from a first segment of a first level metal interconnect line a source word line for the push-pull resistive random access memory cell circuit, the first segment of the first metal interconnect line connected to the contact to the source of the first programming transistor;

forming from a second segment of the first level metal interconnect line a word line for the push-pull resistive random access memory cell circuit, the second segment of the first metal interconnect line connected to the contacts to the gates of the first and second programming transistors;

forming from a third segment of the first level metal interconnect line an interconnect conductor connected to the contacts to the drain of the second programming transistor and the gate of the at least one switch transistor;

forming a fourth segment of the first level metal interconnect line;

forming a first resistive random access memory device over the third segment of the first level metal interconnect line;

forming a second resistive random access memory device over the fourth segment of the first level metal interconnect line;

forming contacts to each of the first and second resistive random access memory devices, to the third segment of the first metal interconnect layer, and to the fourth segment of the first level metal interconnect line;

forming from a first segment of a second level metal interconnect line a bit line for the push-pull resistive random access memory cell circuit connected to the contact to the second resistive random access memory device;

forming from a second segment of the second level metal interconnect line a complementary bit line for the push-pull resistive random access memory cell circuit connected to the contact to the first resistive random access memory device; and forming a third segment of the second level metal interconnect line connected to the contacts to the third segment of the first metal interconnect layer and the first resistive random access memory device.

9. The method of claim 8 wherein forming source and drain regions in the active regions for first and second programming transistors comprises forming a single region to serve as both the drain of the first programming transistor and the source of the second programming transistor.

* * * * *